(12) United States Patent
Frank et al.

(10) Patent No.: US 6,528,814 B1
(45) Date of Patent: Mar. 4, 2003

(54) CRYOGENIC, HIGH-RESOLUTION X-RAY DETECTOR WITH HIGH COUNT RATE CAPABILITY

(75) Inventors: Matthias Frank, Oakland, CA (US); Carl A. Mears, Windsor, CA (US); Simon E. Labov, Berkeley, CA (US); Larry J. Hiller, Livermore, CA (US); Andrew T. Barfknecht, Menlo Park, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 09/395,590

(22) Filed: Sep. 14, 1999

Related U.S. Application Data (60) Provisional application No. 60/100,518, filed on Sep. 16, 1998.

(51) Int. Cl.[7] .............................................. H01L 29/06

(52) U.S. Cl. ...................................................... 257/30

(58) Field of Search ............................. 257/30, 31, 32, 257/35

(56) References Cited

U.S. PATENT DOCUMENTS

| | | | |
|---|---|---|---|
| 4,851,680 A | 7/1989 | Oku | 250/336.2 |
| 5,321,276 A | 6/1994 | Kurakado et al. | 257/32 |
| 5,338,934 A | 8/1994 | Morohashi et al. | 250/336.2 |
| 5,381,001 A | 1/1995 | Perryman et al. | 40/14 |
| 5,994,694 A * | 11/1999 | Frank et al. | 250/281 |

OTHER PUBLICATIONS

Kohlmann et al. "Improved 1 V and 10 V Josephson Voltage Standard Arrays", Jun. 1997, IEEE trans. on Applied Superconductivity, V7, pp3411–3414.*
Labov et al. Supercondcuting tunnel junction x–ray detectors with niobium absorbers and aluminum quasiparticle traps Jul. 1992 pp329–338.*
"A Simple and Robust Niobium Josephson Junction Integrated Circuit Process," Barfknecht, A.T.; Ruby, R.C.; Ko, H.; IEEE Trans Mag., MAG–27, 3125 (1991).
"Josephson Junction Integrated Circuit Process with Planarized PECVD $SiO_2$ Dielectric," Barfknecht, A.T., Ruby, R.C., Ko, H.L., Lee, G.S., IEEE Trans. Appl. Superconductivity, 3, 2201–3 (1993).
"Superconducting tunnel junction x–ray detectors with niobium absorbers and aluminum quasiparticle traps," S.E. Labov, C.A. Mears, G.W. Morris, C.E. Cunningham, M.A. Le Gros, E.H. Silver, A.T. Barfknecht, N.W. Madden, D.A. Landis, F.S. Goulding, R.W. Bland, K.E. Laws, Proc. SPIE vol. 1743, pp. 328–338 (1992).

* cited by examiner

Primary Examiner—Olik Chaudhuri
Assistant Examiner—Douglas A. Wille
(74) Attorney, Agent, or Firm—John P. Wooldridge; Alan H. Thompson (57) ABSTRACT

A cryogenic, high-resolution X-ray detector with high count rate capability has been invented. The new X-ray detector is based on superconducting tunnel junctions (STJs), and operates without thermal stabilization at or below 500 mK. The X-ray detector exhibits good resolution (~5–20 eV FWHM) for soft X-rays in the keV region, and is capable of counting at count rates of more than 20,000 counts per second (cps). Simple, FET-based charge amplifiers, current amplifiers, or conventional spectroscopy shaping amplifiers can provide the electronic readout of this X-ray detector.

15 Claims, 8 Drawing Sheets

CRYOGENIC, HIGH-RESOLUTION X-RAY DETECTOR WITH HIGH COUNT RATE CAPABILITY

This application claims priority in provisional application filed on Sep. 16, 1998, the entitled "A Cryogenic, High-Resolution X-Ray Detector With High Count Rate Capability" Ser. No. 60/100,518, by inventors Matthias Frank, Carl A. Mears, Simon E. Labov, Larry J. Hiller, Andrew T. Barfknecht.

The United States Government has rights in this invention pursuant to Contract No. W-7405-ENG-48 between the United States Department of Energy and the University of California for the operation of Lawrence Livermore National Laboratory.

BACKGROUND OF THE INVENTION

1. Field of the Invention

The present invention relates to cryogenic, high resolution, high count-rate X-ray detectors constructed of Superconducting Tunnel Junctions (STJs). The STJ detectors described herein may prove useful in microanalysis, synchrotron X-ray florescence (XRF) applications, and XRF analysis of light elements (such as Be, B, C, N, O, and F, using K lines), and transition elements (using L lines).

2. Description of Related Art

Cryogenic detectors have been under development as energy dispersive X-ray detectors with high energy resolution for the past ten years. While the energy resolution for X-rays achieved with some cryogenic detectors is an order of magnitude better than for conventional, ionization-based semiconductor detectors, most of the cryogenic detectors developed so far suffer from slow speed. Faster cryogenic detectors developed by others did not exhibit good energy resolution.

Other cryogenic X-ray detectors with good energy resolution require cooling far below the 500 mK required of this device, and additionally require thermal stabilization.

Traditional ionization-based semiconductor detectors, while operable at room temperature, provide only significantly worse energy resolution for soft X-rays.

SUMMARY OF THE INVENTION

The invention involves a sequence of thin film layers built up on a substrate.

Other objects and advantages of the present invention will become apparent from the following description and accompanying drawings.

The present invention is a cryogenic, high-resolution X-ray detector with high count rate capability. The new X-ray detector is based on superconducting tunnel junctions (STJs), and operates without thermal stabilization at or below 500 mK. The X-ray detector exhibits good resolution (~5–20 eV FWHM) for soft X-rays in the keV region, and is capable of counting at count rates of more than 20,000 counts per second (cps). Simple, FET-based charge pre-amplifiers, current pre-amplifiers, together with conventional spectroscopy shaping amplifiers can provide the electronic readout of this X-ray detector.

The feasibility of operating a STJ detector cooled to below 500 mK in the environment of a room-temperature synchrotron beam line has been demonstrated. The results indicate that STJ detectors may prove very useful in X-ray fluorescence measurements and microanalysis applications studying light elements and transition metals with X-ray lines in the region below 1 keV. With the measured STJ detector resolution, the K X-ray lines from the low-Z elements such as Be, B, C, N, O, and F and possibly transition element L lines in between can easily be resolved. In this region the energy resolution of conventional semiconductor detectors, such as Si(Li) detectors, is about an order of magnitude worse than the resolution provided by an STJ detector and not sufficient to separate most of the low-Z element K lines and transition metal L lines.

DETAILED DESCRIPTION OF THE INVENTION

Figure 1A:
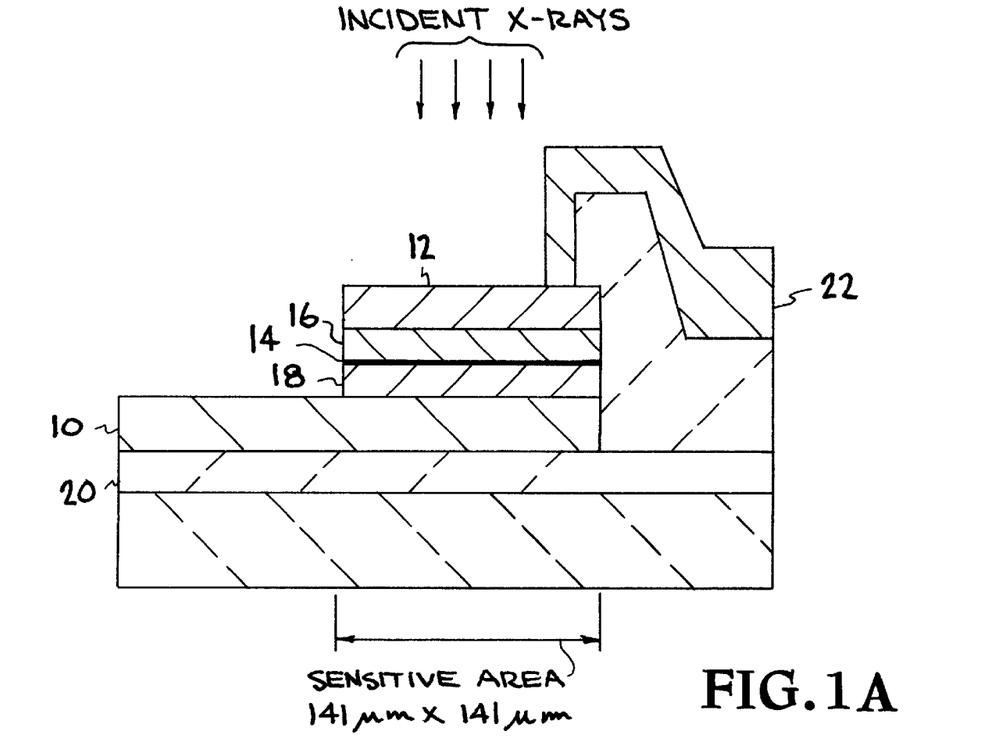
FIG. 1A shows a schematic cross section of an embodiment of the STJ detector of the present invention.
Figure 1B:
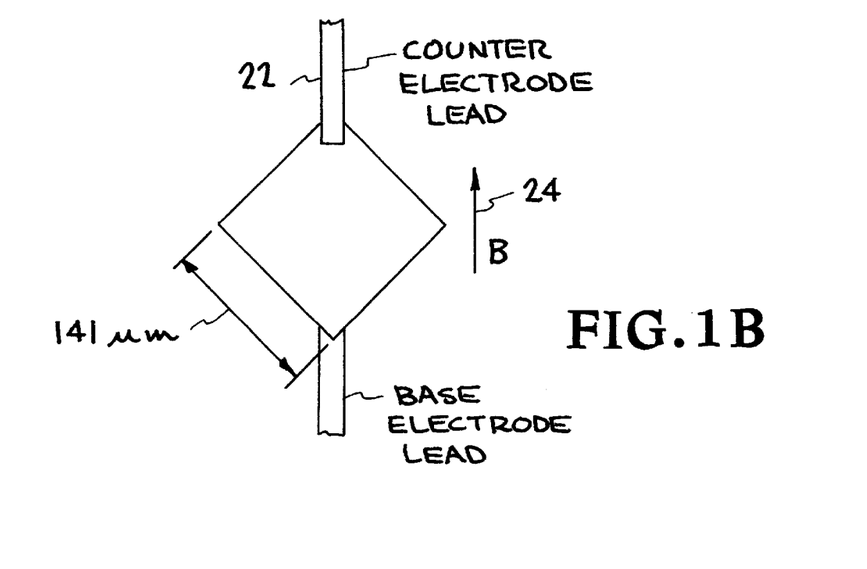
FIG. 1B shows a top view of the present STJ detector.

FIG. 1A shows a schematic cross section of an embodiment of the STJ detector. FIG. 1B shows a top view of the STJ detector. The detector consists of a 265 nm thick Nb base layer 10 and a 165 nm thick Nb counter electrode 12 separated by a thin (~20 Å) $Al_2O_3$ tunnel barrier 14 with 50 nm thick Al "trapping" layers 16,18 on each side. The detector is diamond-shaped with an area of 141 µm×141 µm. This detector was fabricated on a silicon substrate covered by an insulating $SiO_2$ layer 20. The Nb electrode lead 22 is shown in both figures. During operation a small magnetic field (B~100 Gauss) is applied parallel to the tunnel barrier and in the direction indicated in FIG. 1B at 24 in order to suppress the dc Josephson current in the device. This suppression is necessary to allow stable operation of the device when biased near zero voltage (Typically 0.4 mV).

The STJ X-ray detector devices are fabricated at Conductus Inc. using a modification of the niobium-aluminum trilayer process originally developed for SQUIDs (Superconducting Quantum Interference Devices) and digital Josephson junction devices. A 4-inch silicon wafer covered with thermally-grown silicon dioxide is used as a substrate. All metal depositions are done in a cryo-pumped sputtering system which typically maintains a base pressure below 2×10−8 torr. Sputtering conditions are chosen to minimize the stress in the resulting films. The substrates are tightly clamped to copper pucks during the sputter depositions to minimize heating. Oxidation of the Al to form the Al2O3 tunnel barrier is accomplished in the load-lock of the sputtering system, so the wafers never leave the controlled atmosphere of the sputtering system during the trilayer processing.

The initial "trilayer" is deposited in the following manner. (The thickness and the materials of the trapping and absorber layers given are examples—these might be varied based on the intended application of the devices). A 265 nm layer of niobium is deposited by sputtering, followed by a 50 nm layer of aluminum. The wafer is moved to a cryo-pumped load-lock chamber to which oxygen or a mixture containing oxygen is admitted to an appropriate pressure (10 Torr of pure oxygen in many cases, but again chosen based on the application of the devices) in order to oxidize the surface of the aluminum and form the tunnel-barrier. After an appropriate interval, 30 minutes in most cases, the wafer is moved back to the deposition chamber. The second 50 nm layer of aluminum is deposited, followed by 0.165 nm of niobium.

The junction area of the STJ device is defined by photolithography. A channel in the upper niobium layer around the junction is etched by RIE. Without removing the photoresist pattern, both the aluminum layers are chemically-etched in this "channel" with an etchant chosen to minimize the undercut of the top niobium. Again leaving this same resist pattern intact, the exposed area of the etched channel, that is the edges of the top niobium layer and the aluminum layers, and the top of the bottom niobium layer, are anodized. In this way the entire edge of the tunnel junction device is anodized. This may help to reduce leakage currents from tiny shorts which might otherwise occur at the edge of the device.

In a second photolithographic step, the top niobium layer and the aluminum layers are etched away from the wafer, except in what will be the counter electrode region of the STJ devices. In a third photolithographic step, the bottom niobium layer is etched to form the base electrode region and the first wiring layer. The niobium wiring traces leaving the base electrode of the STJ are kept very narrow, typically 5 um wide, in order to minimize the diffusion of quasiparticles from the junction area.

An interlayer dielectric material of silicon dioxide is deposited by plasma-enhanced deposition. To prevent damage to the thin tunnel barrier, the deposition is done at relatively low temperature, typically 180 C., and under conditions chosen so that the stress in the resultant film is low, but slightly compressive.

Vias in the oxide dielectric to the bottom wiring layer and to the counterelectrode region are defined by photolithography and etched by a dry-etch technique. A top layer of niobium, typically 800 nm, is deposited after an in situ sputter etch to insure removal of the native oxide on top of the previous niobium layers in the via openings. The top layer of niobium is then patterned by photolithography and etch to form the top wiring layer.

Figure 2:
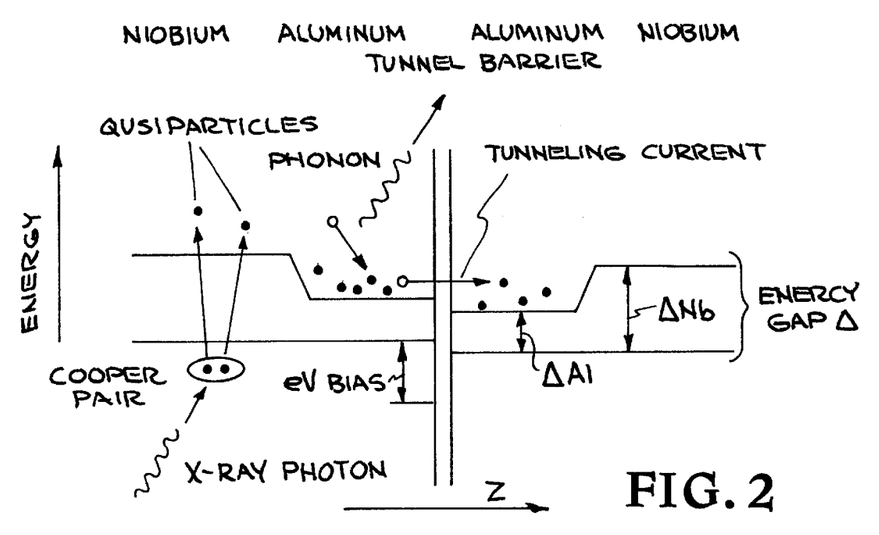
FIG. 2 illustrates the operating principle of the present detector.

The detector operating principle is illustrated in FIG. 2. During operation the detector is cooled to well below the critical temperature of the superconducting layers such that nearly all conduction electrons are bound into Cooper pairs and the number of thermal excitations is negligible. For the detector described here this is the case below ~500 mK where for a typical bias voltage of 0.4 mV the residual leakage current is only about 40 nA. The absorption of an X-ray photon in one of the superconducting electrodes breaks Cooper pairs creating quasiparticle excitations, which can quantum-mechanically tunnel through the $Al_2O_3$ barrier and cause a measurable current signal. The amplitude of the current pulse is proportional to the number of quasiparticles produced and thus to the energy of the absorbed X-ray photon. The height of the current pulse is typically fractions of a microampere. The pulse decay time is given by the quasiparticle life time and details of the electronic readout and is about 4.5 $\mu$s for this detector. The Al "trapping" layers help increasing the signal by concentrating quasiparticles near the tunnel barrier and thus increasing the overall tunneling probability. The process of "quasiparticle trapping" relies on the fact that the Al layers have a lower superconducting gap energy than the Nb layers. Therefore, when the quasiparticle excitations diffuse to one of the Al layers they can relax energetically by emitting a phonon. With a correspondingly lower energy they cannot return into the Nb and thus become trapped in the Al.

Having trapping layers on both sides of the tunneling barrier in the present STJ detector confines the quasiparticles close to the barrier and allows them to tunnel many times before they recombine into Cooper pairs. Multiple tunneling increases the charge measured for a given X-ray energy and, because of the larger charge, minimizes the effect of the electronic noise to the energy resolution. For the detector discussed here, a net signal charge of $\sim 4.1 \times 10^6$ e was measured for the absorption of a 525 eV X-ray photon. Assuming a superconducting energy gap $\Delta=1.5$ meV for the Nb layers and assuming it takes an average energy of $\epsilon=1.7 \Delta$ to create a quasiparticle one would expect a signal charge of $\sim 2 \times 10^5$ e. This indicates the charge multiplication due to multiple tunneling in the present STJ detector is about 20.

The theoretical limit for the FWHM energy resolution of an X-ray spectrometer based on the measurement of the X-ray induced quasiparticle excitations is given by the statistical fluctuations of the number of quasiparticles produced. For X-ray absorption in niobium this fundamental limit is about 5 eV at 6 keV incident X-ray energy. In practice, additional statistical fluctuations associated with the trapping, multiple tunneling and recombination processesmay degrade this limit, but a resolution of ~10 eV at 6 keV should be obtainable.

Figure 3:
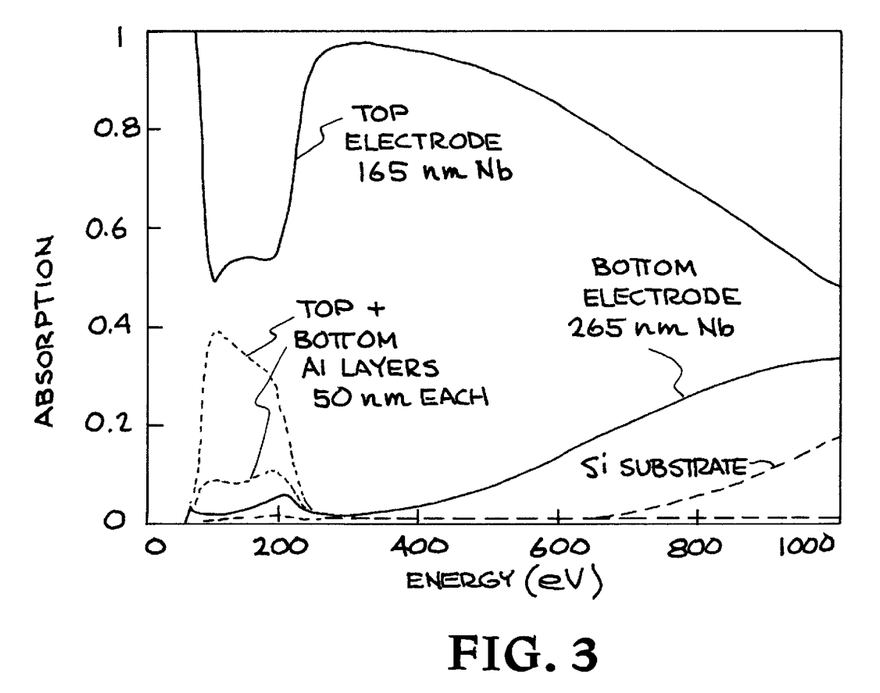
FIG. 3 shows X-ray absorption as function of photon energy in the various layers of the present detector.

FIG. 3 shows the X-ray absorption as function of photon energy in the various layers of the detector calculated using X-ray absorption data from the Center for X-ray Optics (CXRO) at Lawrence Berkeley National Laboratory. In this calculation, potential surface contaminations of the detector which may be present were neglected. Such surface contaminations could consist of $SiO_2$ residues left over from fabrication or Nb oxides formed during extended detector storage in air. During detector operation at low temperature the detector surface may also be covered by a thin layer of frozen residual gases from the cryostat. From FIG. 3, it is expected that most of the X-ray photons in the energy range between 70 and 700 eV would be absorbed in the top Nb layer except for the "window" between ~80–220 eV where Nb is relatively transparent. In this window region a significant fraction of the X-rays are absorbed in the Al trapping layers possibly causing a different detector response.

Figure 4:
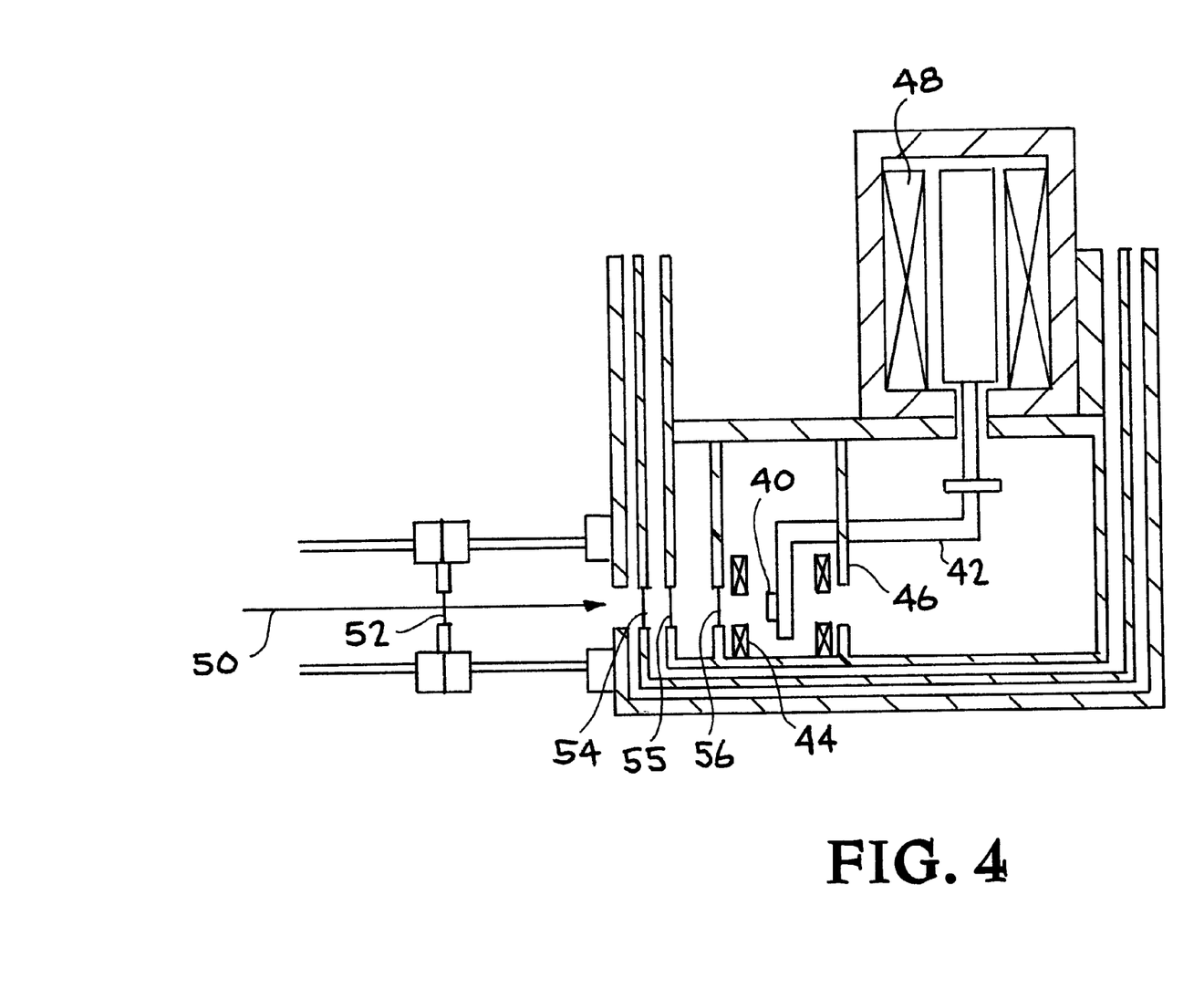
FIG. 4 shows a schematic of an experimental setup used to test the present invention.

A schematic of an experimental setup is shown in FIG. 4. The STJ detector 40 was housed in a pumped liquid helium cryostat (made by Infrared Laboratories) that is equipped with an adiabatic demagnetization refrigerator (ADR) with a base temperature of ~50 mK. The detector 40 was attached to a cold stage 42 in good thermal contact with the ADR and suspended and thermally isolated from the 2K stage by Kevlar strings (the strings are not shown in FIG. 4). A magnetic field coil 44 ("sample magnet") around the detector 40 provided a way to suppress the dc Josephson current in the tunnel junction by means of a small magnetic field (~100 Gauss). The detector and the sample magnet 44 were surrounded by a magnetic shield 46 made of Kryoperm to block the Earth's magnetic field and the residual stray field from the large ADR magnet 48.

During the experiments the temperature was not regulated and was allowed to drift up freely to ~500 mK over a period of 4–6 hours, at which point the detector performance started to degrade. After that, the ADR unit had to be recycled, i.e., run through a magnetization/demagnetization cycle, which typically took about 20 minutes.

The cryostat was mounted onto an adjustable stage and connected to the synchrotron beam line with a flexible bellows. By moving the cryostat, the detector could be aligned with the synchrotron beam. Moving the detector in and out of the center of the beam provided a convenient way of adjusting the count rate. The ultra-high vacuum of the beam line 50 (~few $10^{-9}$ Torr) was separated from the high vacuum of the cryostat (~few $10^{-7}$ Torr during operation) by means of a 1000 Å thin polyimide window 52 on metal mesh fabricated by Luxel. Three additional thin windows 54, 55, 56 were placed into the 77K shield, the 2K shield and the magnetic shield (also at 2K) around the detector to limit the exposure of the detector to infrared radiation emitted from the beam line at 300K. These windows consisted of 200 Å aluminum and 1000 Å of parylene on a 80% open Ni mesh and were fabricated by Lebow, Inc.

An FET-based preamplifier with fast negative feedback was used to measure the current signal from the STJ detector. The rise time of the current pulses was limited by this amplifier to typically ~500 ns, the decay time of the current pulses was given by the quasiparticle life time of about 4–5 $\mu$s. During most measurements, pulses were injected in similar shape from a pulse generator into the electronics to monitor the electronic noise. The X-ray induced current pulses and pulses from the pulse generator were further amplified and shaped either with an Ithaco 4302 filter amplifier with adjustable band pass or with a Canberra 2020 spectroscopy amplifier with a baseline restorer. The shaped pulses were then fed into a pulse height analyzer without any further signal processing. The results obtained at high count rates could probably be improved in the future by applying additional signal processing techniques such as pile-up rejection.

For the measurements described in this section, the X-ray flux onto the detector was limited to a rate below 1000 cps. At this low rate the effect of count rate on energy resolution was negligible.

Figure 5:
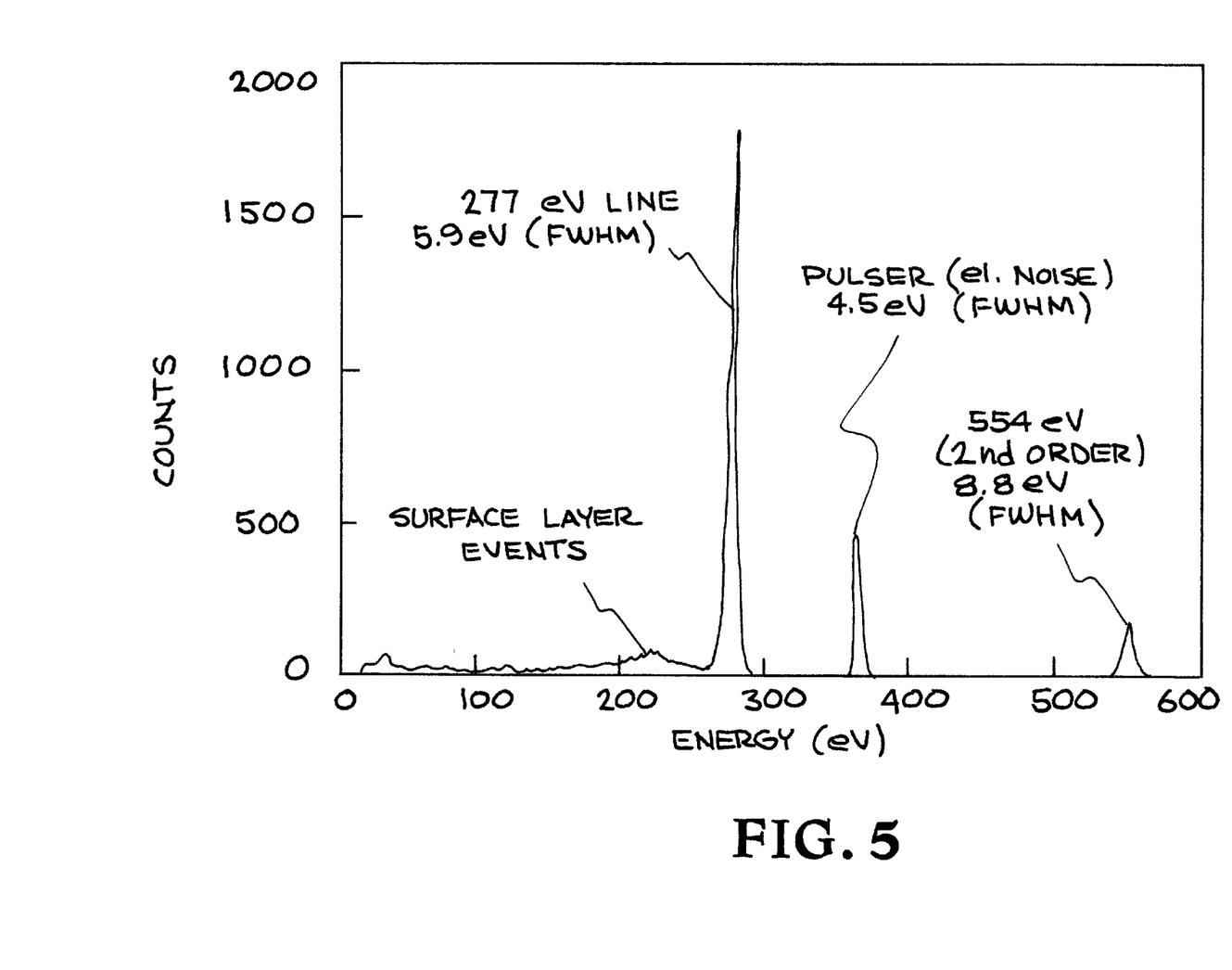
FIG. 5 shows a pulse height spectrum obtained with a synchrotron beam monochromator set to 277 eV which corresponds to the energy of carbon K X rays.

FIG. 5 shows a pulse height spectrum obtained with a synchrotron beam monochromator set to 277 eV which corresponds to the energy of carbon K X rays. The measurement was performed using the Canberra 2020 amplifier with the shaping time constant set to 4 $\mu$s. The count rate for this measurement was 375 cps. At 277 eV, the detector resolution was 5.9+/−0.1 eV (FWHM). The electronic noise in this measurement was 4.5+/−0.1 eV (FWHM) as determined from the width of the "pulser" line. Also present in this spectrum is a 554 eV X-ray line from the second order diffraction in the monochromator resolved with 8.8+/−0.3 eV (FWHM). The presence of second order X rays in the monochromatized beam is convenient in that they provide a second X-ray line for calibrating the measured spectra.

Another feature present in this spectrum are the additional events below the 277 eV line labeled "surface layer events." A "hump" was observed of such events associated with every incident low-energy X-ray line. In contrast, pulser lines were generally "clean" as can be seen from the pulser line in FIG. 5. The number of events in these humps relative to the primary X-ray line was larger at lower incident X-ray energy (see FIG. 6 below). This indicates that these events are due to X-rays absorbed in a surface layer of the present detector. Such a surface layer may be composed of niobium oxide, residues of $SiO_2$ from the detector fabrication process or other surface contaminations. Frozen air or water outgassing from the cryostat could also accumulate on the surface of the detector over time. In either case, the detector response for X-rays absorbed in such a surface layer is expected to be smaller than the detector response for X-rays absorbed in the niobium layers. X-rays absorbed in an insulating surface layer would produce high-frequency phonons which would subsequently be absorbed in the Nb layers creating a smaller number of quasiparticles and a correspondingly smaller signal than X-rays of the same energy absorbed directly in the Nb. Such a surface layer would absorb a larger fraction of lower energy X-rays than of higher-energy X rays, which would explain the relatively larger humps associated with the low-energy X ray lines.

Figure 6:
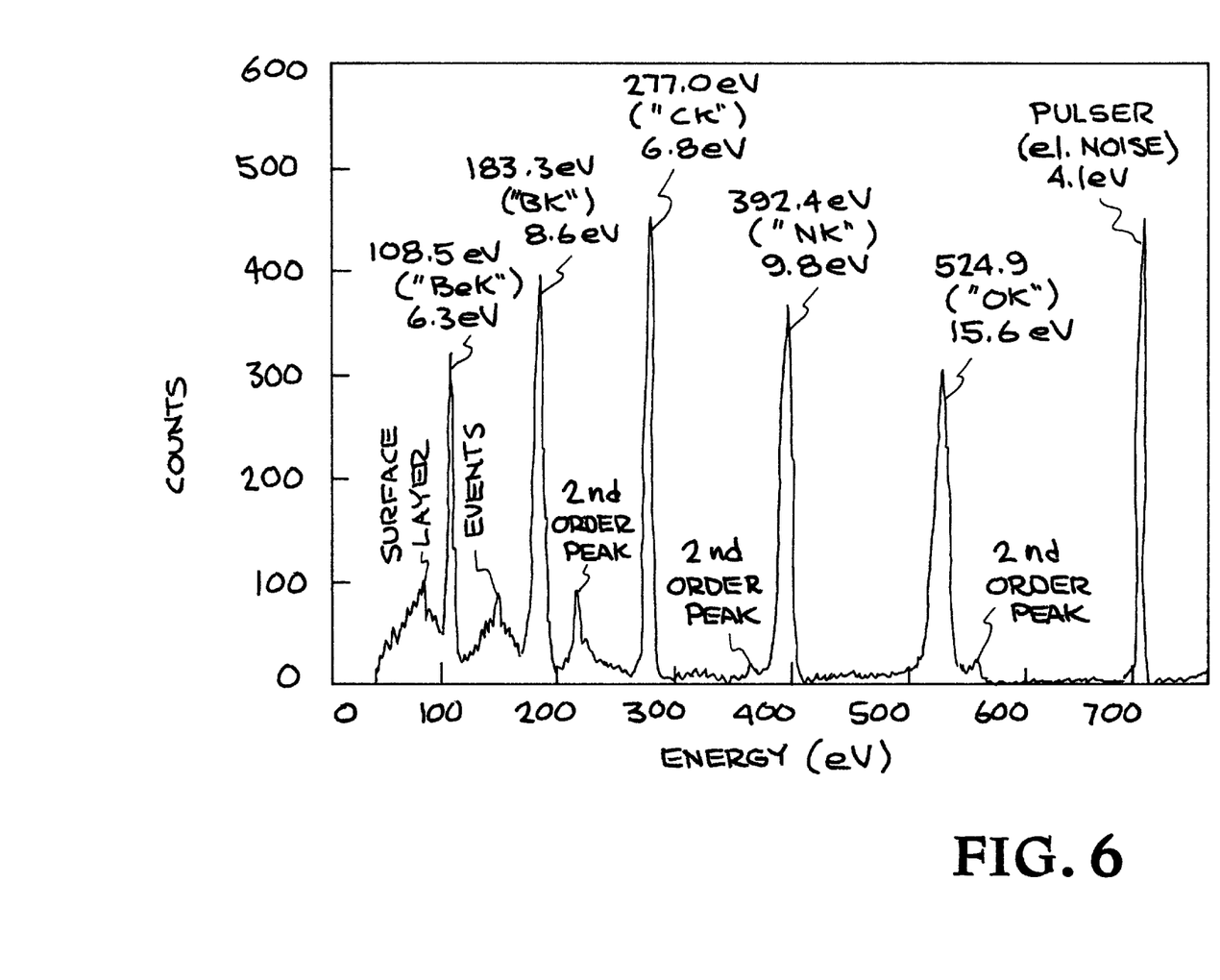
FIG. 6 shows the X-ray spectrum obtained irradiating the STJ detector directly with the synchrotron beam energy tuned successively to the energies corresponding to some of the low-Z element K X-rays.

FIG. 6 shows the X-ray spectrum obtained irradiating the STJ detector directly with the synchrotron beam energy tuned successively to the energies corresponding to some of the low-Z element K X-rays. The incident energy, the corresponding low-Z element and the FWHM energy resolution are given in this figure above the primary X-ray lines. All the primary X-ray lines are well separated in this spectrum. As with the spectrum shown in FIG. 5, there are also some X-ray lines present from second-order diffraction in the monochromator (indicated by "2nd order"). The X-ray lines at lower energies, in particular the 108.5 eV and the 183.3 eV line are accompanied by humps of events below the primary X-ray lines presumably caused by X-ray absorption in the surface layer of the detector as discussed above. The electronic noise in this measurement was 4.1+/−0.2 eV as determined from the width of the pulser line. In this measurement the Ithaco 4302 filter amplifier with a 3.15 kHz–400 kHz band pass was used as the pulse shaping amplifier.

Figure 7A:
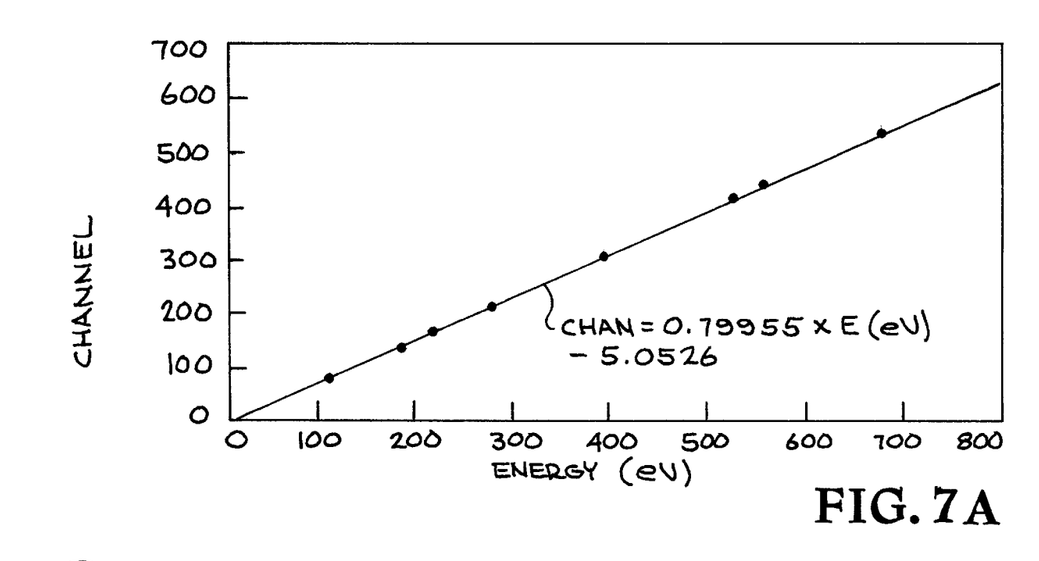
FIG. 7A shows the linearity of the present detector response.
Figure 7B:
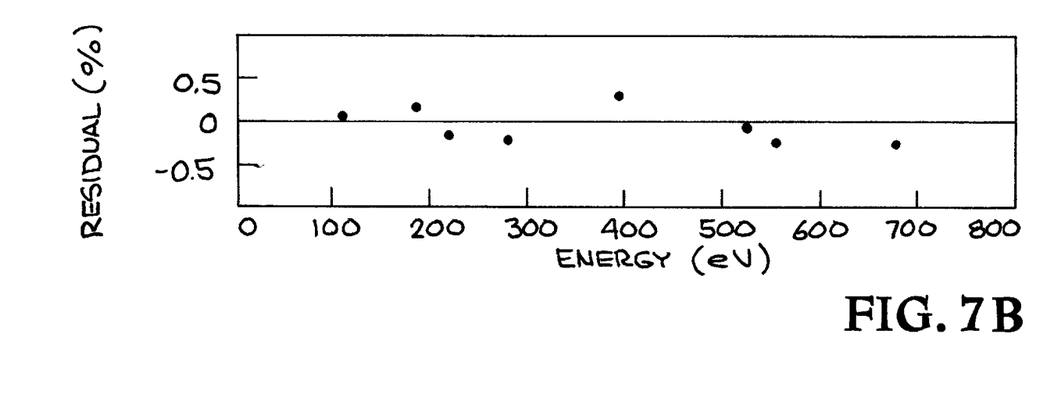
FIG. 7B shows the residuals of a linear fit to the detector response data.

The linearity of the present detector response is shown in FIG. 7A. In this figure, the measured X-ray line position in pulse height analyzer (PHA) channels is plotted versus the X-ray energy. The solid line is a weighed straight-line fit of these data. FIG. 7B shows the residuals calculated by subtracting the fitted PHA values from the experimental values and normalizing to the fitted PHA values. In the energy range shown the detector non-linearity is less than 0.3%.

For the measurements described in the following, the count rate was adjusted to the desired value by adjusting the cryostat position and moving the detector closer to the center of the synchrotron beam. The Canberra 2020 spectroscopy amplifier was used including its automatic baseline restorer. For count rates up to 10,000 cps, optimal results were achieved with shaping times of 3–4 $\mu$s; above 10,000 cps a shaping time of 1.5 $\mu$s was used. No pile-up rejection was applied.

Figure 8:
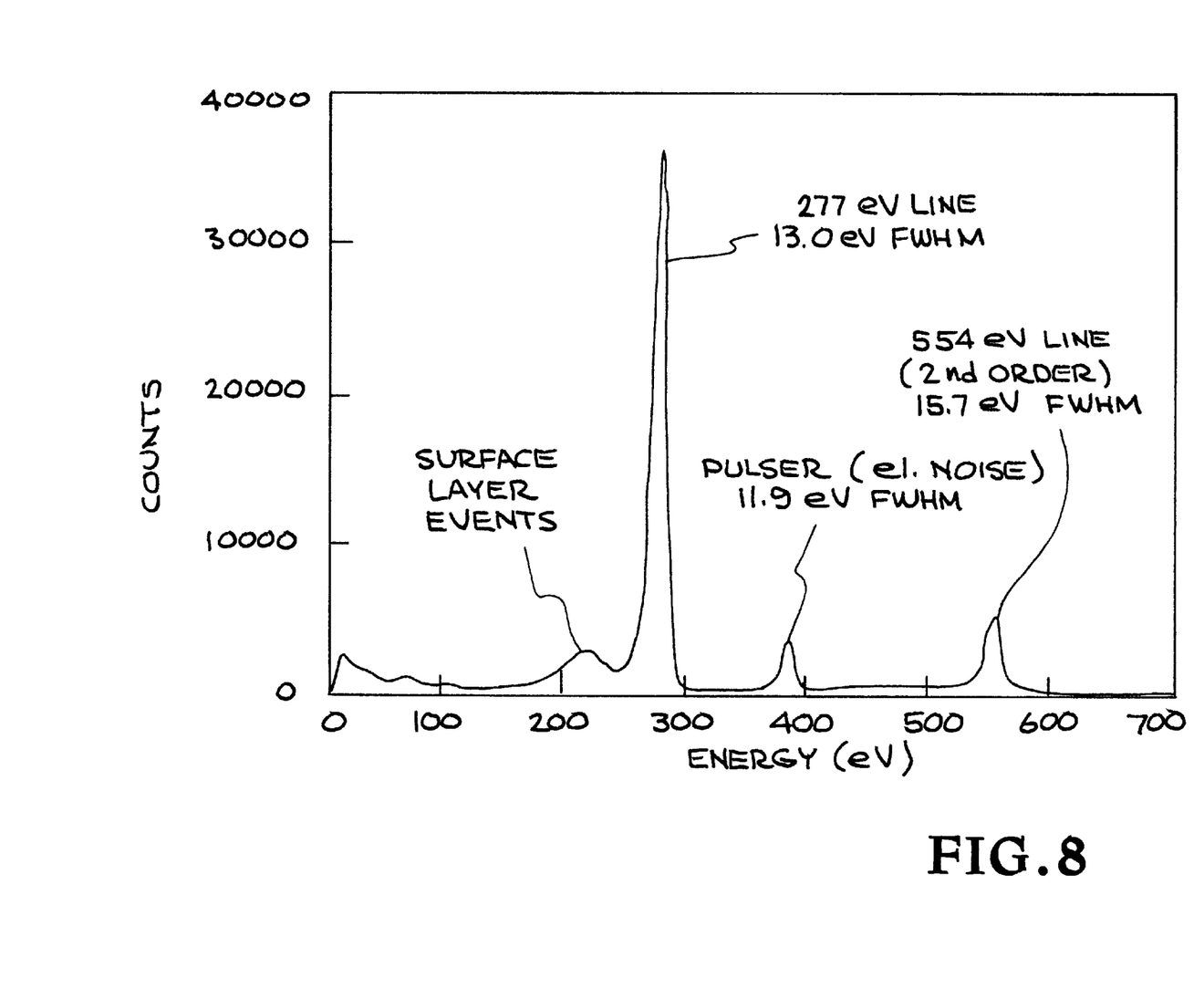
FIG. 8 shows an X-ray spectrum measured at a count rate of 23,300 cps with the incident energy tuned to 277 eV.

FIG. 8 shows an X-ray spectrum measured at a count rate of 23,300 cps with the incident energy tuned to 277 eV. The count rate quoted here was the input count rate into the pulse height analyzer as determined from the total number of counts in the spectrum and the active time of the PHA excluding the dead time, which was 13% in this measurement. The 277 eV line is resolved with an energy resolution of 13.0 eV+/−0.1 eV (FWHM). The energy calibration was performed as before using the second-order X-ray line at 554 eV, which was resolved with 15.7+/−0.2 eV (FWHM). The resolution was largely dominated by the electronic noise of 11.9+/−0.1 eV as measured from the width of the pulser line. The increase of this electronic noise compared to the electronic noise measured at low count rate was caused by baseline fluctuations resulting from the large count rate, pulse pile-up and imperfect baseline restoration. The contribution of the intrinsic energy width of the beam was negligible.

Figure 9:
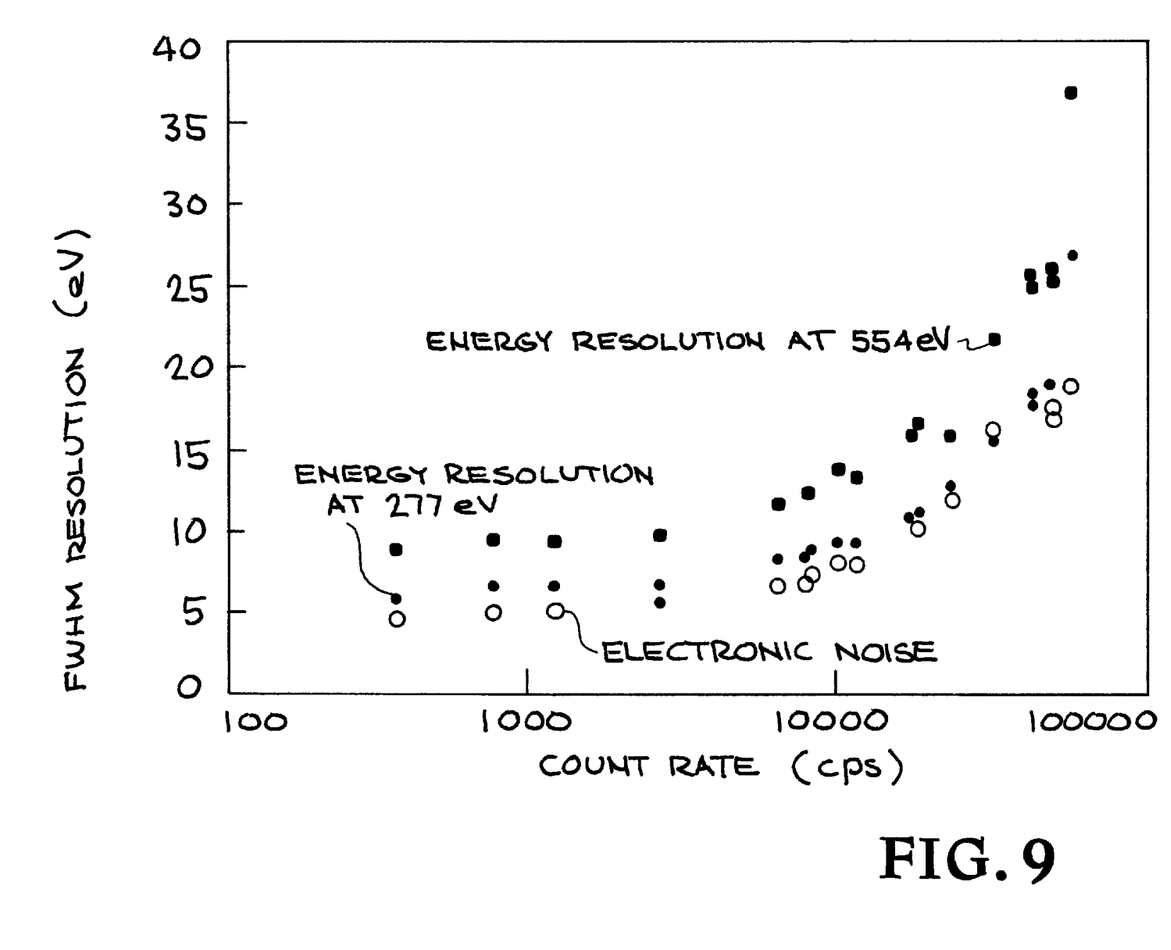
FIG. 9 shows the measured FWHM energy resolution at 277 eV incident X-ray energy (filled circles) and 554 eV (2nd order X-rays, filled squares) plotted together with the measured electronic noise (open circles) as a function of the count rate.

In FIG. 9 the measured FWHM energy resolution at 277 eV incident X-ray energy (filled circles) and 554 eV (2nd order X-rays, filled squares) is plotted together with the measured electronic noise (open circles) as a function of the count rate. Increasing the count rate from low rates of several 100 Hz, the resolution at 277 eV remained nearly constant at 6–8 eV FWHM up to a several 1000 cps. The resolution at 277 eV remained below 10 eV for count rates up to ~10,000 cps and then degraded to 13 eV at 23,000 cps and 20 eV at 50,000 cps. At 50,000 cps the PHA dead time approached 30%. Above 50,000 cps the resolution seemed to degrade rapidly, presumably due to significant pulse pile up.

These results show that STJ detectors can operate at count rates approaching those of semiconductor detectors while still providing a significantly better energy resolution for soft X rays. The superconducting layer thicknesses chosen for the STJ detector presented here provide a good compromise between detector speed, energy resolution and operating temperature. As a result of the present detector geometry, multiple tunneling helps to increase the signal and reduce the effects of electronic noise to the energy resolution. The electronic noise was minimized further by careful shielding and wiring giving some improvement over the inventors previous results. The high X-ray flux available at the synchrotron enabled the actual demonstration of the detector speed rather than estimating count rate performance based on pulse decay time. The rather good detector linearity is most likely a result of using a rather large STJ detector with 141 μm×141 μm area, mitigating the effects of quasiparticle self-recombination. For the STJ detector to be more useful in X-ray spectroscopy applications, particularly at the low end of this energy range, it is desirable to investigate and understand the exact origin of the "surface layer events." The artifacts attributed to surface layer events are not observed in all of the detectors fabricated according to the present invention, and the inventors expect to be able to eliminate them in future devices. This device may be extended in the useful energy range of the detectors to higher energies by replacing the superconducting Nb layers in our STJ detectors by Ta layers which have a much higher stopping power for keV X rays than Nb. Simultaneously, the effective detector area may be increased. The detector embodiment described here measured 141 μm×141 μm. For most practical applications an increase in detector area is desirable. There are several approaches for increasing the area of STJ detectors. Increasing the area of a single STJ detector element generally increases its capacitance which will increase the electronic noise, if a FET-based readout is used. An electronic readout based on high-speed SQUIDs allows reading out larger-area, single-element STJ detectors. A practical limit for the size of a single STJ detector element read out by a SQUID may be ~0.5–1 mm$^2$. A further increase in area could be achieved by grouping STJ detectors into arrays of many detector elements. In series STJ detector arrays, the effective capacitance is reduced (as would be. the X-ray signal) enabling a single-channel, FET-based readout. However, with single-channel readouts the maximum count rate of a series array will be similar to the maximum count rate of a single STJ detector. Large increases in count rate could be obtained by arraying the detectors while simultaneously providing individual electronic channels for each element. These electronic channels would consist of inexpensive FET-based amplifiers and commercial multi-channel data acquisition electronics or Application Specific Integrated Circuits (ASICs). This would increase the effective detector area without increasing the electronic noise and at the same time increase the effective count rate by a factor corresponding to the number of array elements.

The foregoing description of preferred embodiments of the invention has been presented for purposes of illustration and description and is not intended to be exhaustive or to limit the invention to the precise form disclosed. Many modifications and variations are possible in light of the above teaching. The embodiments were chosen and described to best explain the principles of the invention and its practical application to thereby enable others skilled in the art to best use the invention in various embodiments and with various modifications suited to the particular use contemplated. The scope of the invention is to be defined by the following claims.

What is claimed is:

1. An X-ray detector, comprising:

a substrate, coated by an insulating layer;

a base electrode attached to said insulating layer;

a first quasiparticle trapping layer, attached to said base electrode, a tunnel barrier layer, attached to said first trapping layer, a second quasiparticle trapping layer, attached to said tunnel barrier layer, and a counter electrode, attached to said second trapping layer, wherein said base electrode, said first quasiparticle trapping layer, said second quasiparticle trapping layer and said counter electrode each comprise an anodized portion to reduce leakage currents from shorts which might otherwise occur at the edge of said X-ray detector.

2. The X-ray detector of claim 1, wherein said substrate comprises silicon.

3. The X-ray detector of claim 1, wherein said insulating layer comprises silicon dioxide.

4. The X-ray detector of claim 1, wherein said base electrode comprises material selected from a group consisting of Nb, Ta, Pb, Re, Mo and V.

5. The X-ray detector of claim 1, wherein said counter electrode comprises a superconducting material with high X-ray stopping power, and wherein said base electrode comprises a superconducting material.

6. The X-ray detector of claim 1, wherein said first quasiparticle trapping layer comprises material selected from a group consisting of Al, Ti, Hf, Ir and Mo, wherein said second quasiparticle trapping layer comprises material selected from a group consisting of Al, Ti, Hf, Ir and Mo.

7. The X-ray detector of claim 1, wherein said tunnel barrier comprises an oxide selected from a group consisting of Ti, Hf, Ta, Zr and Al.

8. The X-ray detector of claim 1, wherein said counter electrode comprises material selected from a group consisting of Nb, Ta, Pb, Re, V and Mo.

9. The X-ray detector of claim 1, further comprising means for operating said detector within a magnetic field applied parallel to said tunnel barrier layer.

10. The X-ray detector of claim 4, wherein said base electrode is approximately 265 nm thick.

11. The X-ray detector of claim 6, wherein said first quasiparticle trapping layer and said second quasiparticle trapping layer are approximately 50 nm thick.

12. The X-ray detector of claim 7, wherein said tunnel barrier is approximately 20 Angstroms thick.

13. The X-ray detector of claim 8, wherein said counter electrode is approximately 165 nm thick.

14. The X-ray detector of claim 1, further comprising an FET-based preamplifier operatively connected to said X-ray detector to measure a current signal from said X-ray detector.

15. The X-ray detector of claim 1, wherein said X-ray detector is diamond shaped.

* * * * *